US010535456B2

(12) United States Patent
Delaet et al.

(10) Patent No.: US 10,535,456 B2
(45) Date of Patent: Jan. 14, 2020

(54) PERMANENT MAGNET COMPRISING A STACK OF FERROMAGNETIC AND ANTIFERROMAGNETIC LAYERS

(71) Applicant: COMMISSARIAT A L'ENERGIE ATOMIQUE ET AUX ENERGIES ALTERNATIVES, Paris (FR)

(72) Inventors: Bertrand Delaet, Bernin (FR); Mathilde Cartier, Grenoble (FR); Marie-Claire Cyrille, Sinard (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 434 days.

(21) Appl. No.: 15/307,265

(22) PCT Filed: Apr. 16, 2015

(86) PCT No.: PCT/FR2015/051040
§ 371 (c)(1),
(2) Date: Oct. 27, 2016

(87) PCT Pub. No.: WO2015/166159
PCT Pub. Date: Nov. 5, 2015

(65) Prior Publication Data
US 2017/0053724 A1    Feb. 23, 2017

(30) Foreign Application Priority Data

Apr. 28, 2014    (FR) ..................... 14 53839

(51) Int. Cl.
*H01F 7/02*    (2006.01)
*H01F 41/02*    (2006.01)
*H01F 1/00*    (2006.01)

(52) U.S. Cl.
CPC .......... *H01F 7/021* (2013.01); *H01F 1/0009* (2013.01); *H01F 41/0253* (2013.01)

(58) Field of Classification Search
None
See application file for complete search history.

(56) References Cited

U.S. PATENT DOCUMENTS 8,257,596 B2    9/2012 Mather et al.
2004/0075957 A1    4/2004 Li et al.
(Continued)

FOREIGN PATENT DOCUMENTS

EP    2 597 655 A1    5/2013
FR    2 892 871 A1    5/2007
(Continued)

OTHER PUBLICATIONS

International Search Report dated Jul. 30, 2015 in PCT/FR2015/051040, filed Apr. 16, 2015.
(Continued)

*Primary Examiner* — Xiaowei Su
(74) *Attorney, Agent, or Firm* — Oblon, McClelland, Maier & Neustadt, L.L.P.

(57) ABSTRACT

A permanent magnet includes at least two antiferromagnetic layers and at least two first ferromagnetic layers. A magnetization direction of each first ferromagnetic layer is set, by an exchange coupling, with one of the antiferromagnetic layers of the stack, parallel to and in the same direction as the magnetization directions of the other first ferromagnetic layers. The permanent magnet also includes at least one second ferromagnetic layer. A magnetization direction of each second ferromagnetic layer is pinned only by RKKY (Ruderman-Kittel-Kasuya-Yosida) coupling with at least one of the first ferromagnetic layers or with at least one other of the second ferromagnetic layers.

18 Claims, 3 Drawing Sheets

(56) References Cited

U.S. PATENT DOCUMENTS

2009/0015252 A1* 1/2009 Raberg .................. B82Y 25/00
324/252
2011/0151589 A1 6/2011 Redon

FOREIGN PATENT DOCUMENTS

| JP | 2006-10579 A | 1/2006 |
| WO | WO 2009/137802 A1 | 11/2009 |
| WO | WO 2010/084165 A1 | 7/2010 |

OTHER PUBLICATIONS

Dirk Ettelt et al. "3D Magnetic Field Sensor Concept for Use in Inertial Measurement Units (IMUs)" Journal of Microelectromechanical Systems, vol. 23, No. 2, Apr. 2014, pp. 324-333.

J. P. Nozieres et al. "Blocking Temperature Distribution and Long-Term Stability of Spin-Valve Structures with Mn-based Antiferromagnets" Journal of Applied Physics, vol. 87, No. 8, Apr. 15, 2000, pp. 3920-3925.

J. Nogues et al. "Exchange Bias", Journal of Magnetism and Magnetic Materials, vol. 192, 1999, pp. 203-232.

Simon Foner "Versatile and Sensitive Vibrating-Sample Magnetometer", Review of Scientific Instruments, vol. 30, No. 7, Jul. 1959, 11 pages.

M106: "Vibrating Sample Magnetometry", Basic Laboratory: Materials Science and Engineering, Christian-Albrechts-Universitat zu Kiel, Sep. 5, 2011, 10 pages.

\* cited by examiner

PERMANENT MAGNET COMPRISING A STACK OF FERROMAGNETIC AND ANTIFERROMAGNETIC LAYERS

The invention relates to a permanent magnet and a magnetic field sensor incorporating this permanent magnet. The invention also relates to a method for manufacturing this permanent magnet.

Known magnetic field sensors incorporate permanent magnets for measuring the amplitude, in a given direction, of a magnetic field to be measured. Such sensors are described, for example, with reference to FIG. 4 of patent application US 2011/0151589 or with reference to FIGS. 1A through 8 of patent application WO 2010/0084165.

The permanent magnets used in these sensors, unlike the "pinned layers" used in spin or GMR ("Giant Magnetoresistance") valves and in tunnel or TMR ("Tunnel Magnetoresistance") junctions, have to generate a large magnetic field. As a reminder, in spin valves and tunnel junctions, the magnetic field generated by the pinned layer must on the contrary be small to allow the magnetization direction of the free layer to rotate and align along the direction of an external magnetic field. Thus, in permanent magnets, the magnetization of the pinned layers is set whereas in the case of dynamic structures, such as MRAM (Magnetoresistive Random Access Memory) or TAMRAM (Thermally-Assisted Magnetic Random Access Memory) structures, for example, this magnetization evolves during the use of the structure.

To obtain a large magnetic field, in known sensors, the permanent magnet is produced using a stack of ferromagnetic layers and antiferromagnetic layers. Typically, this stack includes:
- at least one antiferromagnetic layer, and
- at least two first ferromagnetic layers, the magnetization direction of each first ferromagnetic layer being pinned, by an exchange coupling, with one of the antiferromagnetic layers of the stack, parallel to and in the same direction as the magnetization directions of the other first ferromagnetic layers.

More precisely, in known permanent magnets each ferromagnetic layer is sandwiched between two antiferromagnetic layers. Hereafter, ferromagnetic and antiferromagnetic layers refer to layers made, respectively, of ferromagnetic material and antiferromagnetic material. Such embodiments of a magnet are described with reference to FIG. 1A of patent application US 2011/0151589 and with reference to FIGS. 10A and 10B of patent application WO 2010/0084165.

Hereafter, the magnetic field of such a permanent magnet comprising a stack of ferromagnetic and antiferromagnetic layers is considered as large if the following relationship proves true: $\Sigma M_i t_i s_i \geq 50 \times 10^{-9}$ T.m and, preferably, greater than $10^{-7}$ T.m, where:

- $M_i$ is the amplitude of the magnetization of the ferromagnetic layer $C_i$ of thickness $t_i$,
- $s_i$ is equal to "+1" if the direction of the magnetic moment of the ferromagnetic layer $C_i$ is parallel to and in the same direction as the overall magnetic moment of the permanent magnet and, equal to "−1" if the direction of the magnetic moment of the ferromagnetic layer $C_i$ is parallel and opposite to the direction of the overall magnetic moment of the permanent magnet,
- i is the order number of the layer $C_i$ in the stack of ferromagnetic and antiferromagnetic layers of the permanent magnet, and
- the symbol "$\Sigma$" is the sum for all the existing ferromagnetic layers in the stack of ferromagnetic and antiferromagnetic layers.

For information, this sum $\Sigma M_i t_i s_i$ is generally very much less than $50 \times 10^{-9}$ T.m in the reference layers or pinned layers of the spin valves or tunnel junctions for the reasons explained above.

Writing that a permanent magnet verifies the following relationship $\Sigma M_i t_i s_i \geq 50 \times 10^{-9}$ T.m is equivalent to saying that the total magnetic moment of this magnet per unit surface area is greater than $(50 \times 10^{-2})/(4\pi)$A. Indeed, a magnetic moment μ is expressed in A.m² in the International System (SI) or in emu in the CGS system. The magnetization M is equal to the magnetic moment μ per unit volume and is therefore expressed in A/m in the International System or in emu/cm3 in the CGS system. Therefore a magnetization M multiplied by a thickness t is expressed in A in the International System or in emu/cm² in the CGS system. Because a magnetization M multiplied by a thickness t is expressed in A in the SI system or in emu/cm² in the CGS system it is described as a product of magnetic moment per unit surface area. Hence, the magnetic field of a permanent magnet is large if its magnetic moment per unit surface area is greater than $(50 \times 10^{-2})/(4\pi)$A and, preferably, greater than $1/(4\pi)$A.

The magnetic moment per unit surface area of a permanent magnet comprising a stack of ferromagnetic and antiferromagnetic layers may easily be measured. For example, the magnetic moment of the permanent magnet is measured by the VSM ("Vibrating Sample Magnetometry") method. This method is well known. It is, for example, described in the following articles:

Simon FONER, "Versatile and Sensitive Vibrating-Sample Magnetometer", The Review of Scientific Instruments, Volume 30, number 7, July 1959, Christian Albrechts, "Vibrating Sample Magnetometry", University of Kiel, M106, 2011.

The magnetic moment thus measured is then divided by the volume of ferromagnetic material contained in this magnet to obtain its magnetization. Whatever the stack, the dimensions of the ferromagnetic layers may easily be measured, for example, by observing vertical sections of this stack with a microscope. In particular, these observations can be used to measure the thickness $t_i$ of each ferromagnetic layer. Finally, the magnetization thus obtained is multiplied by the sum of the thicknesses $t_i$ of each ferromagnetic layer to obtain the magnetic moment of this magnet per unit surface area. Generally, the ferromagnetic layers of the stack all have the same surface area in a plane perpendicular to the stacking direction of these layers. Consequently, the magnetic moment measured for the magnet may also be divided by the surface area of the ferromagnetic layers, or by the surface area of the permanent magnet if it is equal to the surface area of the ferromagnetic layers, to obtain the magnetic moment per unit surface area.

Figure 1:
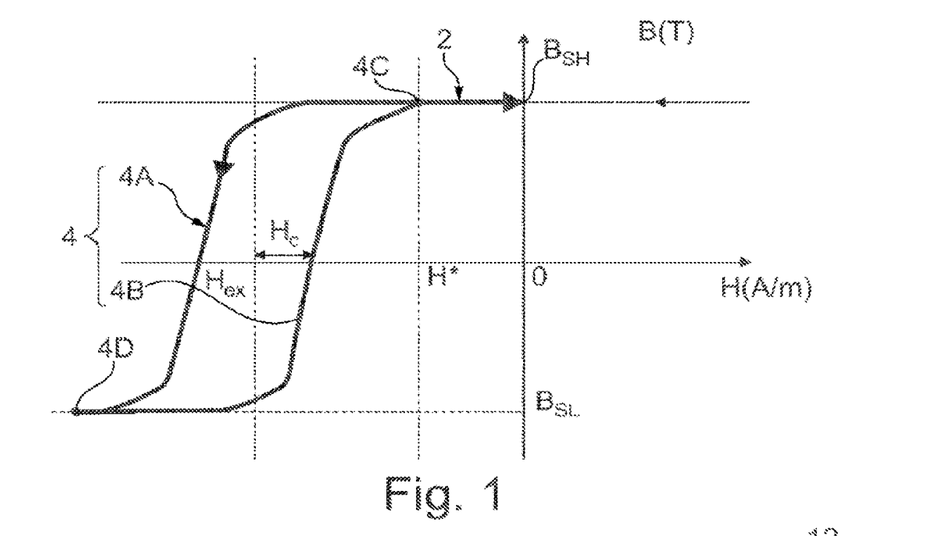
FIG. 1 is a schematic illustration of the hysteresis cycle of a permanent magnet produced from a stack of ferromagnetic and antiferromagnetic layers.

The magnetization of such a permanent magnet, typically exhibits a hysteresis cycle such as that represented in FIG. 1.

FIG. 1 will now be used for defining certain terms. The curve 2 represents the evolution of the magnetization, denoted by B in the figures, of the permanent magnet as a function of the magnetic field H. More precisely, the magnetization B varies between two extreme values $B_{SL}$ and $B_{SH}$. When the magnetization of the permanent magnet reaches the value $B_{SH}$, its magnetization can no longer increase even if the magnetic field H increases. Then it is said that the magnet is saturated. The same phenomenon occurs when the magnetization reaches the value $B_{SL}$ and the magnetic field continues to decrease. Between these two extreme values, the curve 2 defines a hysteresis cycle 4. The cycle 4 comprises:

a curve 4A which descends as the magnetic field H decreases, and a curve 4B which ascends as the magnetic field H increases.

The curves 4A and 4B meet on one side at a point 4C and on the other side at a point 4D. Between these points 4C and 4D, the curves 4A and 4B are separate. Beyond point 4C and below point 4D, the curves 4A and 4B merge and the permanent magnet is saturated. Here, point 4C is the closest to the ordinate axis.

At points 4C and 4D, the difference between the curves 4A and 4B is equal to 1% of the value of $B_{SH}$.

In the case of permanent magnets formed by the stacking of ferromagnetic and antiferromagnetic layers, the hysteresis cycle 4 is, generally, shifted to the left as represented in FIG. 1. More precisely, the cycle 4 is shifted, with respect to the ordinate axis, by a value $H_{ex}$ hereafter referred to as the exchange field $H_{ex}$ or field $H_{ex}$. This field $H_{ex}$ is also known as the "exchange bias". Typically, the value of the field $H_{ex}$ corresponds to the value of the abscissa of the point located midway between the two points where the cycle 4 intersects this abscissa axis. In this graph, the abscissa axis represents the magnetic field H.

The coercive field $H_c$ or field $H_c$ of the permanent magnet is the half-width of the cycle 4. Typically, its value is taken as equal to the difference between the value of the field $H_{ex}$ and a point of intersection of the cycle 4 with the abscissa axis.

The field H* is also defined as being the smallest magnetic field from which the hysteresis of the permanent magnet disappears, i.e. as described above, the magnetic field for which the hysteresis is less than 1% of the value $B_{SH}$. Here, the value of the field H* is equal to the value of the abscissa of point 4C.

The larger the quantity of ferromagnetic materials contained in the permanent magnet, the more the sensitivity of the magnetic field sensor increases. Thus, a known solution for increasing the sensitivity of the magnetic field sensor consists in increasing the number of ferromagnetic and antiferromagnetic layers stacked in the permanent magnet.

However, this leads to both increasing the space requirement of the permanent magnet and increasing the quantity of antiferromagnetic materials. Furthermore this leads to production difficulties associated notably with the structuring of a thick stack.

The prior art is also known from:

US2004/075957A1,

ETTELT DIRK et Al: "3D Magnetic Field Sensor Concept for use in Inertial Measurement Units (IMUs)", Journal of Microelectromechanical systems, IEEE Service Center, US, vol. 23, no. 2, Apr. 1, 2014, pages 324-333, NOZIERES J P et Al: "Blocking temperature distribution and long-term stability of spin-valve structures with Mn-Based antiferromagnets", Journal of Applied Physics, American Institute of Physics, US, Vol. 87, no. 8, Apr. 15, 2000, pages 3920-3925,

JP2006010579A,

EP2597644A1.

The invention is aimed at increasing the quantity of ferromagnetic materials of a magnet obtained by the stacking of ferromagnetic and antiferromagnetic layers without necessarily increasing the quantity of antiferromagnetic materials contained in this permanent magnet.

For this purpose, the subject matter of the invention is a permanent magnet as claimed in claim 1.

The permanent magnet above further comprises, compared to known magnets, second ferromagnetic layers the magnetization directions of which are only pinned by an RKKY (Ruderman-Kittel-Kasuya-Yosida) coupling. The use of an RKKY coupling in this permanent magnet pins the magnetization direction of the second ferromagnetic layers without having to add antiferromagnetic materials in the stack and without having to modify the thickness of the antiferromagnetic layers which pin the magnetization direction of the first ferromagnetic layers. Thus, when such a permanent magnet is used in a magnetic field sensor, this enables the sensitivity of the sensor to be increased without increasing the quantity of antiferromagnetic materials used to produce the permanent magnet. It also enables a permanent magnet to be obtained whereof the field H* is higher than in the prior art.

The embodiments of this permanent magnet may comprise one or more of the features of the dependent claims.

These embodiments of the permanent magnet further offer the following advantages:

selecting the thickness of the first ferromagnetic layers so that the resulting field H* for the magnet is of the same sign as $H_{ex}$ and of an absolute value greater than 795 A/m or even advantageously 3978 A/m, increasing the insensitivity of the permanent magnet to external magnetic interference;

using only ferromagnetic RKKY couplings for pinning the magnetization direction of the second ferromagnetic layers enables, for the same quantity of ferromagnetic materials contained in the stack, an overall magnetization to be obtained for the permanent magnet greater than that of other possible configurations;

using antiferromagnetic RKKY couplings for pinning the magnetization direction of the second ferromagnetic layers, enables a more stable permanent magnet to be obtained since the coupling is stronger;

using a pattern including a superimposition of p second ferromagnetic layers simplifies the method for manufacturing this permanent magnet;

using a pattern comprising an antiferromagnetic layer used for pinning a ferromagnetic layer, by exchange coupling, on each side, further limits the quantity of antiferromagnetic materials used for producing this stack;

producing the permanent magnet with a form factor greater than or equal to two facilitates the alignment of the magnetization direction of each ferromagnetic layer in the longitudinal direction of the permanent magnet during its manufacture.

The subject matter of the invention is also a magnetic field sensor as claimed in the sensor independent claim.

Finally, the subject matter of the invention is also a method for manufacturing the above permanent magnet.

The invention will be better understood on reading the description that follows, given solely by way of a non-restrictive example referring to the drawings, in which.

In these figures, the same references are used for designating the same elements. In the remainder of this description, the features and functions well known to the person skilled in the art are not described in detail.

Figure 2:
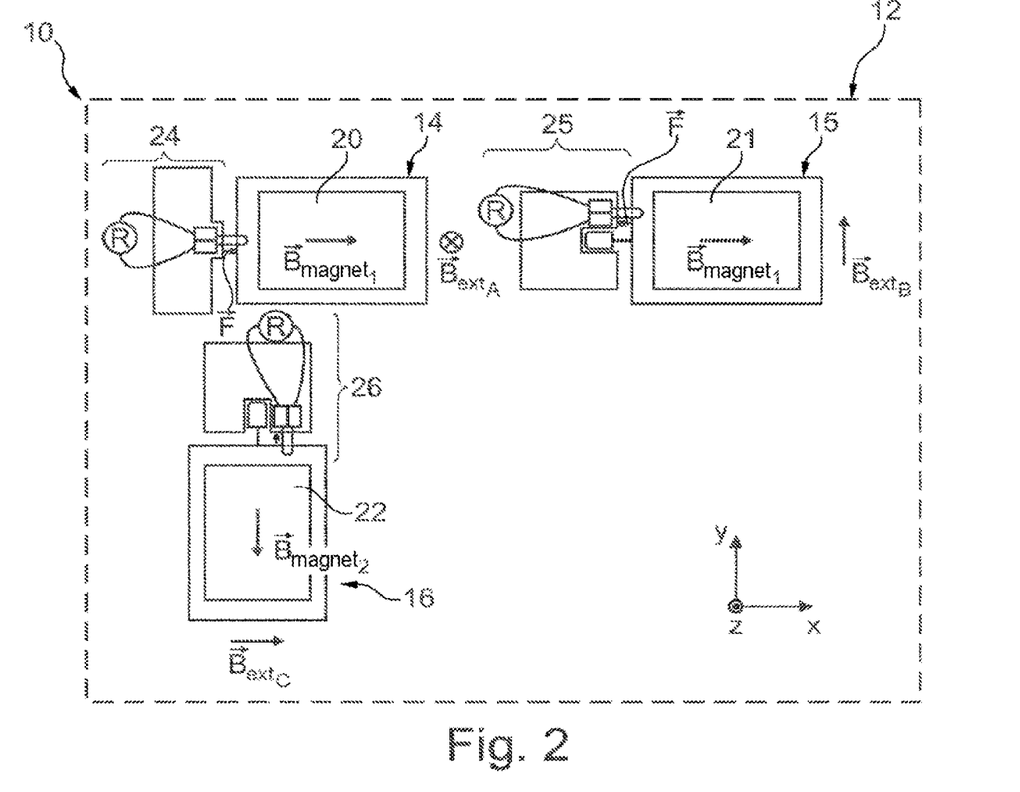
FIG. 2 is a schematic illustration of a top view of a magnetic field sensor.

FIG. 2 represents a magnetic field sensor 10. This sensor 10 is identical to the sensor described with reference to FIG. 8 of patent application WO 2010/0084165, except as regards the structure of the permanent magnets used. Thus, only a brief description of the general architecture of this sensor is given for illustrating one embodiment of such a sensor.

This sensor 10 includes:
- a substrate 12 extending essentially in a horizontal plane parallel to orthogonal directions X and Y, and
- three single axis magnetometers 14 to 16 implemented on the substrate 12.

A direction Z, perpendicular to the X and Y directions, represents the vertical. Hereafter, the following figures are oriented with respect to this same X, Y, Z reference frame. In addition, terms such as "above", "below", "bottom", "top" are defined with respect to this direction Z.

The magnetometers 14 to 16 measure the amplitude of the magnetic field to be measured in the directions, respectively, Z, Y, and X. For this purpose, each magnetometer 14 to 16 comprises:
- a permanent magnet, respectively 20 to 22, capable of moving with respect to the substrate 12, and
- a transducer, respectively 24 to 26, capable of converting the movement of the permanent magnet into a corresponding variation in current or voltage.

For example, the transducers 24 to 26 are piezoresistive transducers. Typically, these transducers are attached, without any degree of freedom, both onto the substrate 12 and to the permanent magnet.

Here, the permanent magnets 20 to 22 are identical except for the fact that the direction of the overall magnetic moment of the permanent magnet 22 is perpendicular to that of the permanent magnets 20 and 21. Accordingly, only a detailed description of the permanent magnet 20 is given below.

Figure 3:
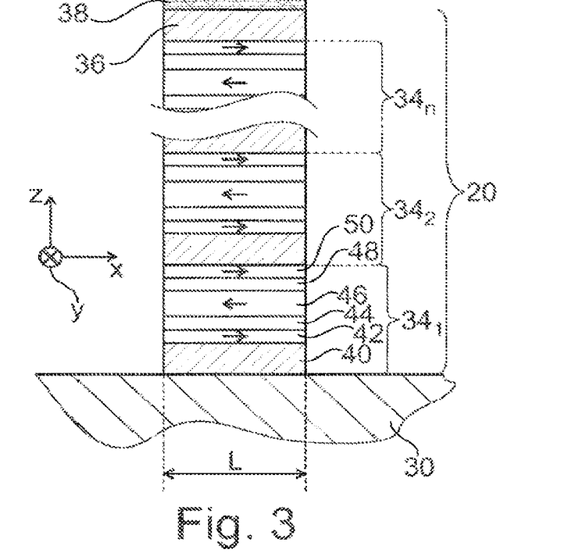
FIG. 3 is a schematic illustration in longitudinal vertical section of a permanent magnet of the sensor in FIG. 2.

FIG. 3 represents the permanent magnet 20 deposited on a base 30 that is movable with respect to the substrate 12. For example, the base 30 is obtained by etching the substrate 12. Only a portion of this base 30 is represented in FIG. 3.

The magnet 20 is formed of a stack, in a stacking direction, of ferromagnetic and antiferromagnetic layers. Here, the stacking direction is parallel to the direction Z. In FIG. 3 and the following figures, the following conventions are adopted:
- the antiferromagnetic layers are hatched,
- the direction of the magnetic moment of a ferromagnetic layer is represented by an arrow,
- the wavy lines in the middle of the stack indicate that an intermediate portion of this stack has not been represented,
- the proportions between the thicknesses of the various layers are not respected in order to improve the readability of the figures, and
- the proportion between the length L and the height of the stack is not respected in order to reduce the size of the figures in the longitudinal direction of the stack.

Here, the stack exhibits a parallelepiped shape and a form factor greater than or equal to 2, 5, or 20, or even greater than 100 or 1000. In this embodiment, the form factor is defined as being the ratio of the length L over the width W of the stack. Here, the length is parallel to the direction X and the width W is parallel to the direction Y.

The larger the form factor the easier it is to align the magnetization direction of the ferromagnetic layers on the longitudinal direction of the stack. For example, the width of the stack is less than 20 µm or 10 µm and the length L is greater than 50 µm or 100 µm or 1 mm. The height of the stack is generally greater than 100 µm or 500 µm. This height is measured between the layer of the stack closest to the base 30 and the layer of this same stack farthest from the base 30.

Here, the stack of ferromagnetic and antiferromagnetic layers is composed successively in the direction Z:
- of a pattern 34 repeated n times, then
- an antiferromagnetic layer 36 then, typically,
- an encapsulation layer 38 deposited at the top of this stack.

The layer 38 is intended to protect the permanent magnet from chemical and/or physical attack from the outside environment. This layer 38 is made of a non-magnetic material. Non-magnetic material refers here to a material devoid of any magnetic property likely to interfere with the operation of the permanent magnet 20. Generally, it is a material of which the magnetic properties are non-existent or not measurable.

For example, the layer 38 is made of tantalum (Ta) and its thickness is greater than or equal to 5 nm.

The layer 36 is, for example, identical to the layer 40 described farther on.

Hereafter, the first occurrence of the pattern 34 in the stack, i.e. that which is the closest to the base 30 bears the reference $34_1$, the second occurrence immediately above this first occurrence $34_1$ bears the reference $34_2$ and so on up to the occurrence $34_n$.

Here, the occurrences $34_1$ to $34_n$ are stacked directly one above the other and are therefore not separated from each other by any other layer not belonging to the pattern 34.

The number n of repetitions of the pattern 34 is generally selected for reaching a desired height of the stack. This height depends on the intended application. However, preferably, n is greater than or equal to 2, 5, or 10. n is also generally less than 50 or 100.

In this embodiment, the various occurrences of the pattern 34 are all identical to each other and only the occurrence $34_1$ will therefore be described in detail.

The occurrence $34_1$ is composed successively in the direction Z:
- of an antiferromagnetic layer 40,
- a ferromagnetic layer 42 the magnetization direction of which is pinned by exchange coupling with the antiferromagnetic layer 40,
- a non-magnetic layer 44 known as a "spacer",
- a ferromagnetic layer 46 the magnetization direction of which is pinned by antiferromagnetic RKKY (Ruderman-Kittel-Kasuya-Yosida) coupling with the ferromagnetic layer 42,
- a non-magnetic layer 48 forming a spacer, and
- a ferromagnetic layer 50 the magnetization direction of which is pinned by exchange coupling with the antiferromagnetic layer 40 of the occurrence $34_2$ of the pattern 34 located just above the occurrence $34_1$.

In this description, the antiferromagnetic materials used are, for example, selected from the group consisting of:

alloys of manganese, and
NiO, and
$Fe_2O_3$.

The antiferromagnetic alloys of manganese are typically PtMn, NiMn, PdPtMn, FeMn and IrMn. In this example, the antiferromagnetic material selected for the layer 40 is the alloy PtMn.

Similarly, in this description, the ferromagnetic materials used for producing the ferromagnetic layers are selected from the group consisting of cobalt, nickel, iron and their alloys. For example, the ferromagnetic material is often CoFe or NiFe or CoFeB. Here, the layer 42 is made of CoFe.

In this embodiment, the magnetization direction i.e. the direction of the magnetic moment of the layer 42 is parallel to and in the same direction as the direction X. Typically, the amplitude of the saturation magnetization of the layer 42 is greater than or equal to 0.5 T or 1 T or 2 T. It is recalled here that a Tesla is equal to $10^7/(4\pi)$A/m, This magnetization direction is pinned by an exchange coupling with the layer 40. An exchange coupling between a ferromagnetic layer and an antiferromagnetic layer appears if:
  the ferromagnetic layer is directly deposited on the antiferromagnetic layer, or
  only separated from the antiferromagnetic layer by one (or more) very thin non-magnetic layer(s) the total thickness of which is less than 0.5 nm, and preferably less than 0.4 nm or 0.2 nm.

Exchange coupling between ferromagnetic and antiferromagnetic layers is well known. For example, the reader may refer to the following article: J. Nogués and Ivan K. Schuller, "*Exchange bias*" Journal of Magnetism and Magnetic Materials 192 (1999), 203-232.

The presence of the exchange coupling between the ferromagnetic layer and the antiferromagnetic layer is notably expressed by a shift, for example, to the left as illustrated in FIG. 1, of the hysteresis cycle of the assembly of these two layers and therefore by the appearance of a non-zero field $H_{ex}$.

Here, the thicknesses of the layers 40 and 42 are selected to obtain a good exchange coupling between these two layers. In this description, it is considered that the exchange coupling is good if:
  this results in a ratio $H_{ex}/H_e$ strictly greater than 1 and, preferably, greater than 2 or 4, and
  the appearance of an exchange field $H_{ex}$ the absolute value of which is greater than 50 Oe (3978 A/m) and, preferably, greater than 100 Oe (7957 A/m) or 200 Oe (15915 A/m) or 500 Oe (39788 A/m) at 25° C.

The fields $H_{ex}$ and $H_c$ of a stack comprising only the layers 40 and 42 may be measured experimentally or obtained by numerical simulation.

In the event of a large amount of external magnetic interference a good exchange coupling allows returning to the initial state after the disappearance of this interference.

The thickness of the layers 40 and 42 is, for example, determined by experimentation or by numerical simulation by successively testing different thicknesses for a stack formed only of one antiferromagnetic layer and one ferromagnetic layer made of the same materials as the layers 40 and 42. With regard to the most common antiferromagnetic and ferromagnetic materials, the appropriate thicknesses are known to the person skilled in the art. For example, typically, the thickness of the layer 40 is between 5 and 100 nm and, preferably, between 7 and 25 nm or between 10 and 25 nm. The thickness of the layer 42 is often between 0.5 nm and 100 nm. In this example, the thickness of the layer 40 is two or three or ten times greater than the thickness of the layer 42 to obtain this good exchange coupling. Here, the thickness of the layer 40 is 20 nm while the thickness of the layer 42 is 0.8 nm.

The layer 44 is made of a non-magnetic material. In this description, the non-magnetic materials used are typically selected from the group consisting of ruthenium, rhodium, silver, chromium, tantalum, copper, etc. Here, the layer 44 is made of ruthenium. The thickness of the layer 44 is selected so that there is an RKKY coupling between the layer 42 and the ferromagnetic layer 46. Depending on the thickness of the layer 44, the RKKY coupling is either ferromagnetic, i.e. the magnetization directions of the coupled ferromagnetic layers are identical, or antiferromagnetic, i.e. the magnetization directions of the coupled ferromagnetic layers are opposite. If the evolution of the RKKY coupling is plotted between the ferromagnetic layers as a function of the thickness of the layer 44, a damped sine curve is obtained. The first extremum, in the order of increasing thicknesses of the non-magnetic layer, of this damped sine curve corresponds to an antiferromagnetic RKKY coupling and the second extremum corresponds to a ferromagnetic RKKY coupling. It is these RKKY couplings corresponding to the first two extrema of the damped sine curve which are used in the embodiments described here. For example, in the case of a non-magnetic layer made of ruthenium, the antiferromagnetic RKKY coupling is obtained for a thickness of 0.8 nm while the ferromagnetic RKKY coupling is obtained for a thickness of 1.4 nm.

Here, the thickness of the layer 44 is 0.8 nm, and consequently, the layers 42 and 46 are magnetically coupled by an antiferromagnetic RKKY coupling.

The magnetization direction of the layer 46 is therefore pinned, in this embodiment, without it being necessary to use an exchange coupling and therefore an additional antiferromagnetic layer.

The thickness of the layer 46 may be selected to be large since the thickness of this layer has no influence on the quality of the exchange coupling between the layers 40 and 42. Here, the thickness of the layer 46 is selected so that the following relationship proves true:

$M_2 t_2 \geq X^* M_1 t_1$, where:

$M_1$ and $t_1$ are, respectively, the magnetization and the thickness of the ferromagnetic layer 42, and
  $M_2$ and $t_2$ are, respectively, the magnetization and the thickness of the ferromagnetic layer 46,
  X is a whole number equal to two and, preferably, equal to five or ten or 15.

In the example, the layer 46 is made of the same ferromagnetic material as the layer 42.

Thus, for substantially increasing the quantity of ferromagnetic materials of the permanent magnet 20, the thickness of the layer 46 is selected preferably greater than two or five or ten times the thickness of the layer 42. For example, the thickness of the layer 46 is greater than 5 or 10 nm and generally less than 100 nm. For the following simulations, the thickness of the layer 46 is taken as equal to 16 nm.

The amplitude of the saturation magnetization of the layer 46 is also greater than 0.5 T or 1 T or 2 T.

The layer 48 is a non-magnetic spacer the thickness of which is selected for creating an antiferromagnetic RKKY coupling between the ferromagnetic layers 46 and 50. For this purpose, it is identical to the layer 44.

The ferromagnetic layer 50 is magnetically coupled on one side to the layer 46 by the antiferromagnetic RKKY coupling and, on the other side, to the antiferromagnetic layer 40 of the occurrence 34₂. The layer 50 is designed so that there is a good exchange coupling with the antiferromagnetic layer 40 of the occurrence 34₂. For this, the thickness of the layer 50 may be selected as the thickness of the layer 42. For example, here, the layers 50 and 42 are structurally identical.

It will be noted that in this embodiment, the magnetization directions of the layers 42 and 50 are pinned by exchange couplings while the magnetization direction of the layer 46 is only pinned by RKKY couplings.

The superimposition of the layers 42 to 50 forms something known under the acronym of SAF ("Synthetic antiferromagnetic"). Here, we define a SAF as being a superimposition of ferromagnetic and non-magnetic layers in which all the ferromagnetic layers are magnetically coupled with each other by antiferromagnetic RKKY couplings. The magnetic moment of such a SAF is proportional to the following sum: $\Sigma M_i t_i s_i$, where:
- the terms $M_i$, $t_i$ and $s_i$ are the same as those defined in the introduction to this patent application, and
- the symbol "$\Sigma$" is the sum for all the existing ferromagnetic layers in this SAF.

Here, the thicknesses of the ferromagnetic layers are selected so that this sum is not zero. This is then referred to as an unbalanced SAF. In this embodiment, the SAF comprises three ferromagnetic layers and it is therefore also termed a double SAF.

The overall magnetic moment of the permanent magnet 20 is proportional to the sum of the magnetic moments of the SAFs of the stack.

In this embodiment, the thickness of the layers 42 and 50 is reduced to obtain a good exchange coupling and therefore to increase the value of the field $H_{ex}$. In addition, thanks to the introduction of the ferromagnetic layer 46 the magnetization direction of which is only pinned by RKKY couplings, it is also possible to increase the ratio R. The ratio R is equal to the ratio of the volume of ferromagnetic materials over the volume of antiferromagnetic materials contained in the magnet 20. Accordingly, this embodiment enables both increasing the ratio $H_{ex}/H_c$ while maintaining or increasing the ratio R. Thus, the permanent magnet 20 exhibits:
- an increased insensitivity to external magnetic interference since the increase in the ratio $H_{ex}/H_c$ moves the field H* away from the ordinate axis, and
- the sensitivity of the sensor incorporating this permanent magnet is better since the volume of ferromagnetic materials has been increased.

Finally, increasing the ratio $H_{ex}/H_c$ is also useful for manufacturing the magnet 20 in the form of a longilineal bar. Indeed, it is known that the shaping of the permanent magnet in the form of a longilineal bar having a large form factor increases the value of the field $H_c$ while the field $H_{ex}$ remains constant. Thus, if before shaping the ratio $H_{ex}/H_c$ is not large enough, after shaping, the field H* is very close to zero or greater than zero so that this magnetized bar is then very sensitive to external magnetic interference. This phenomenon is represented in FIG. 4.

Figure 4:
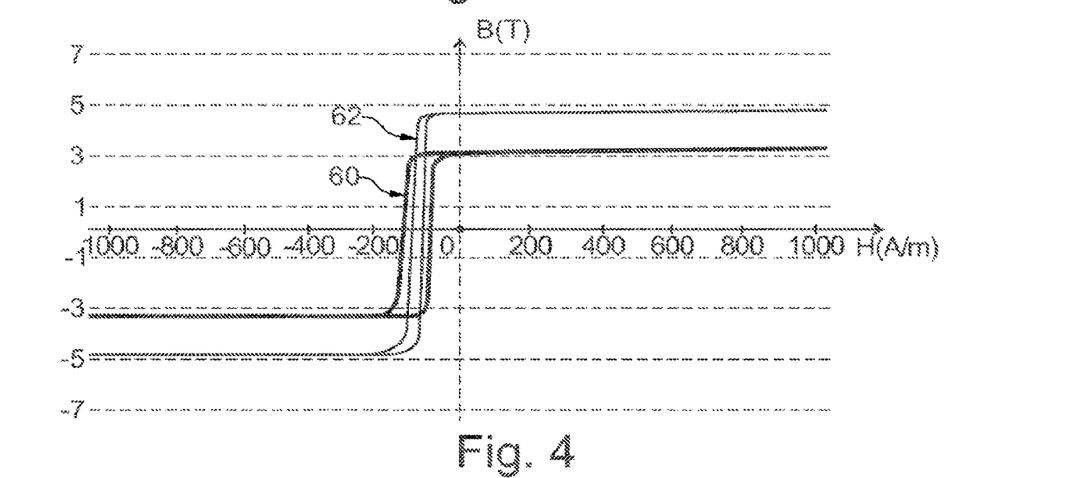
FIG. 4 is a graph illustrating the hysteresis cycle of the permanent magnet in two particular cases of the form factor.

The graph in FIG. 4 represents:
- a hysteresis cycle 60 of the permanent magnet 20 in the particular case where its length is equal to 200 μm and its width W is equal to 4 μm, and
- a hysteresis cycle 62 of a stack identical to that of the permanent magnet 20 but implemented over a large surface area, e.g. greater than 1 or 5 mm² and with a form factor equal to one.

The cycles 60 and 62 have been obtained by measurement. They clearly illustrate the fact that the ratio $H_{ex}/H_c$ decreases when the permanent magnet is shaped for having a large form factor.

Figure 5:
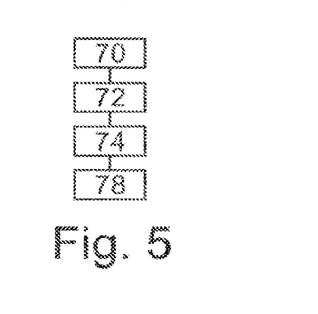
FIG. 5 is a flow chart of a method for manufacturing the permanent magnet in FIG. 3.

FIG. 5 represents a method for manufacturing the permanent magnet 20. More precisely, in a step 70, the various layers described with reference to FIG. 3 are deposited one on top of the other. For this, methods are used which are known in the field of microtechnologies and the production of microchips. In step 70, no particular shaping is given to this stack of layers. This stack covers at least the locations where the magnets 20 to 22 have to be produced.

In a step 72, this stack is structured so as to only leave bar-shaped stacks at the locations where the magnets 20 to 22 have to be produced. Thus, at the conclusion of this step, there remain only bars having the required form factors, i.e. generally higher than 2, 10 or 100.

Then, in a step 74, the bars are heated so that the temperature of the antiferromagnetic layers exceeds their ordering temperature. This annealing is performed under a saturating magnetic field as described, for example, in patent application US 2011/0151589.

Then as described, for example, in patent application US 2011/0151589, in a step 78, the bars are cooled under a weaker field until the exchange couplings between the ferromagnetic and antiferromagnetic layers appear and pin the magnetization directions of each ferromagnetic layer. The permanent magnets 20 to 22 are then obtained.

For the other steps in the manufacture of the sensor 10, the reader may refer to the patent applications previously cited in the introduction.

Figure 6:
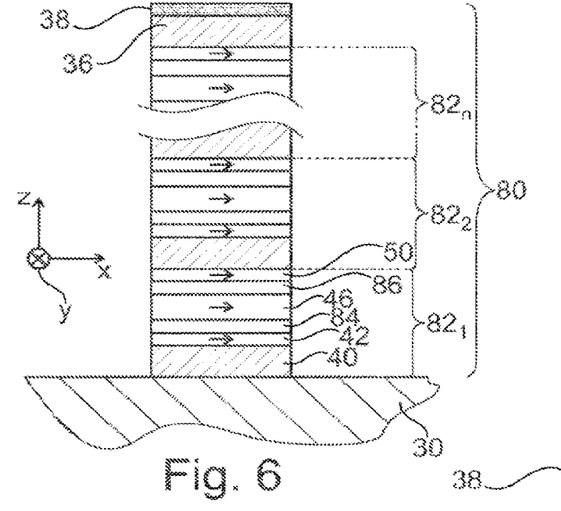
FIGS. 6 through 8 are schematic illustrations in longitudinal vertical section of other possible embodiments of the permanent magnets of the sensor in FIG. 2.

FIG. 6 represents a permanent magnet 80. The magnet 80 is identical to the magnet 20 except that the pattern 34 is replaced by a pattern 82. The pattern 82 is identical to the pattern 34 except that the non-magnetic layers 44 and 48 are replaced, respectively, by non-magnetic layers 84 and 86. The layer 84 is identical to the layer 42 except that its thickness is selected for obtaining a ferromagnetic RKKY coupling between the ferromagnetic layers 42 and 46. For example, the thickness of the layer 84 is selected equal to 1.4 nm. The layer 86 is identical to the layer 84.

In this embodiment, the magnetization directions of all the ferromagnetic layers are in the same direction. Thus, for the same number n of patterns as in the embodiment in FIG. 3, the amplitude of the magnetic moment of the permanent magnet 80 is greater than the amplitude of the magnetic moment of the permanent magnet 20. However, the RKKY coupling energy between the layers 46 and the layers 42 and 50 is weaker than in the case of the permanent magnet 20. In this embodiment, the stacking of the ferromagnetic layers 42, 84, 46, 86, 50, forms a stack that will be referred to hereafter as an FSF. An FSF like a SAF is a superimposition of ferromagnetic and non-magnetic layers in which all the ferromagnetic layers are magnetically coupled with each other by RKKY couplings. However, in an FSF, at least one of these RKKY couplings is a ferromagnetic RKKY coupling.

Figure 7:
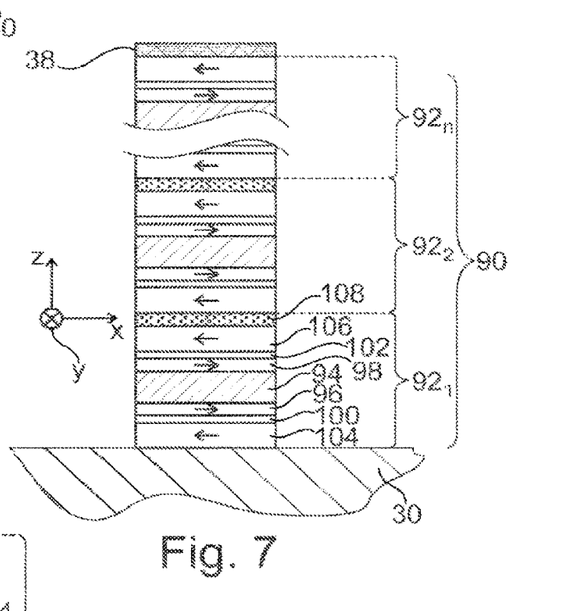

FIG. 7 represents a permanent magnet 90. The magnet 90 is identical to the magnet 20 except that the pattern 92 repeated n times is different from the pattern 34. The pattern 92 comprises:
- one antiferromagnetic layer 94,
- two ferromagnetic layers 96, 98 located on each side of the antiferromagnetic layer 94, the magnetization directions of which are pinned by exchange coupling with the layer 94, two non-magnetic layers 100, 102 in direct contact, respectively, with the ferromagnetic layers 96 and 98, two ferromagnetic layers 104 and 106 the magnetization directions of which are only pinned by antiferromagnetic RKKY couplings with, respectively, the ferromagnetic layers 96 and 98, and one lamination layer 108 that magnetically isolates the ferromagnetic layer 106 from the layer 104 in the occurrence 92$_2$ of the pattern 92 located just above.

The exchange couplings and antiferromagnetic RKKY couplings in the pattern 92 are, for example, obtained as described with reference to the pattern 34. Thus, here, the layers 94, 96, 98, 100 and 102 are identical to the layers, respectively, 40, 42, 50, 44 and 48. The layers 104 and 106 are, for example, identical to the layer 46.

The lamination layer 108 magnetically decouples the layer 106 from the layers of the occurrence 92$_2$. For example, this lamination layer is made of a non-magnetic material selected from the group consisting of the following materials MgO, Mg, Ta, and TiO$_2$. Typically, its thickness is greater than 5 or 10 nm.

Thus the pattern 92 comprises:

two ferromagnetic layers 96, 98 the magnetization directions of which are pinned by exchange coupling with the antiferromagnetic layer 94, and two ferromagnetic layers 104 and 106 the magnetization directions of which are only pinned by RKKY couplings.

In this embodiment, the pinning of the magnetization directions of the layers 96 and 98 by exchange coupling is obtained by using only a single antiferromagnetic layer and not two as in the magnet 20.

Figure 8:
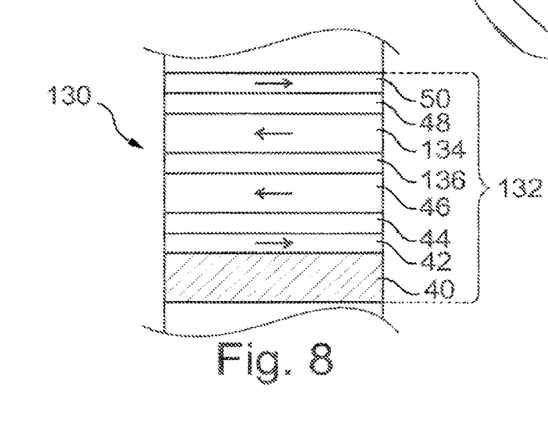

FIG. 8 represents a permanent magnet 130. This magnet 130 is identical to the magnet 20 except that the pattern 34 is replaced by a pattern 132. In order to simplify FIG. 8, only the pattern 132 is represented. The pattern 132 is identical to the pattern 34 except that a ferromagnetic layer 134 and a non-magnetic layer 136 are inserted between the layers 48 and 46 of the pattern 34. The layer 134 is made, for example, of the same ferromagnetic material as the layers 42, 46 and 50. For example, the layer 134 is identical to the layer 46. The magnetization direction of the layer 134 is pinned by an antiferromagnetic RKKY coupling with the layer 50. For this purpose, the layer 48 is interposed between the ferromagnetic layers 50 and 134. The magnetization direction of the layer 134 is also pinned by a ferromagnetic RKKY coupling with the layer 46. For this purpose, the layer 136 is interposed between the ferromagnetic layers 134 and 46. The thickness of the layer 136 is selected for obtaining a ferromagnetic RKKY coupling. For example, the layer 136 is a layer of ruthenium 1.4 nm thick.

The pattern 132 forms an FSF with four ferromagnetic layers in which the magnetization directions of two of these ferromagnetic layers are only pinned by RKKY couplings.

Many other embodiments are possible. For example, the thickness of the layers 100 and 102 may be increased so as to obtain a ferromagnetic RKKY coupling between the layers 96 and 104, and between the layers 98 and 106 instead of an antiferromagnetic RKKY coupling.

The thickness of the non-magnetic layers 44, 48 and 136 may also be modified to obtain only ferromagnetic RKKY couplings between the various ferromagnetic layers of the same pattern.

The pattern 82 comprises an FSF with three ferromagnetic layers. The pattern 132 comprises an FSF with four ferromagnetic layers. As a variant, these FSFs may be replaced by an FSF or a SAF with p ferromagnetic layers, where p is a whole number greater than or equal to 5 or 6. Generally, p remains less than 10.

In another variant, p is equal to two. For this, for example, the layers 96, 100 and 104 of the pattern 92 are omitted. However, in the latter variant, the number n of patterns is then greater than or equal to two for having at least two ferromagnetic layers in the stack the magnetization directions of which are pinned by exchange coupling with an antiferromagnetic layer.

Similarly, in the pattern 92, the one or two SAFs located on each side of the antiferromagnetic layer 94 may each be replaced by SAFs or FSFs with more than two ferromagnetic layers.

The various ferromagnetic layers of the same pattern are not necessarily made of the same ferromagnetic materials. For example, one of these layers may be made of CoFe and another of NiFe.

The thicknesses of the various ferromagnetic layers pinned by an exchange coupling may be different from one another. For example, the thicknesses of the layers 42 and 50 or of the layers 96 and 98 are different from one another. Similarly, the thicknesses of the ferromagnetic layers the magnetization directions of which are only pinned by RKKY couplings may be different. For example, the thicknesses of the layers 104 and 106 or the layers 46 and 134 are different from one another.

In the preceding embodiments, the ferromagnetic layers the magnetization directions of which are pinned by exchange coupling have a thickness five or ten times less than the thickness of the ferromagnetic layers the magnetization directions of which are only pinned by RKKY couplings. Thus, in these embodiments, for each pair of ferromagnetic layers comprising a ferromagnetic layer the magnetization direction of which is pinned by exchange coupling and a ferromagnetic layer the magnetization direction of which is pinned by RKKY coupling, the following first relationship is true $M_2 t_2 \geq X^* M_1 t_1$, where X is equal to five or ten. As a variant, this relationship between the thicknesses is not respected. For example, the thickness of the ferromagnetic layers the magnetization directions of which are pinned by exchange coupling is five or ten times greater than that of the ferromagnetic layers the magnetization directions of which are only pinned by RKKY couplings. Thus, as a variant, a stack is constructed using a pattern identical to the pattern 34 except that the thickness of the layers 42 and 50 is greater than or equal to 10 nm and the thickness of the layer 46 is less than 1 nm. In this variant, it is a second relationship, the inverse of the first relationship, i.e. $M_1 t_1 \geq X^* M_2 t_2$, which is true for each pair of ferromagnetic layers, with X equal to five or ten. When the stack respects the first or the second relationship, the quantity of ferromagnetic material inside this stack is substantially increased without, however, increasing the quantity of antiferromagnetic material.

It is also possible to combine different patterns in the same stack. For example, it is possible to construct a stack by alternating the patterns 34 and 82 or the patterns 34 and 132.

The stack does not necessarily have a parallelepiped shape. For example, the section of the stack parallel to the X, Y directions is an ellipse or an oval. In these latter cases, the form factor of the permanent magnet is defined as being the ratio of the length over the width of the parallelepiped of smallest volume fully containing the stack.

As a variant, the form factor of the stack is not necessarily greater than or equal to two. For example, it may be equal to one.

An adhesive layer between the first occurrence of the pattern and the base 30 on which the permanent magnet must be attached may be provided for improving the adhesion of the first pattern on this base.

The ferromagnetic layers are not necessarily each formed by a single homogeneous block of ferromagnetic material. For example, each ferromagnetic layer may also be laminated as described in patent application FR 2 892 871 in the passage page 13, lines 5 to 9.

The ferromagnetic layers may also consist of a set of multiple ferromagnetic strips directly superimposed on one another e.g. bilayers of NiFe/CoFe or TbCo/CoFeB.

The invention claimed is:

1. A permanent magnet including a stack of ferromagnetic and antiferromagnetic layers, the stack comprising:
    at least two antiferromagnetic layers;
    at least two first ferromagnetic layers, a magnetization direction of each first ferromagnetic layer being set, by an exchange coupling, with one of the antiferromagnetic layers of the stack, parallel to and in a same direction as the magnetization directions of the other first ferromagnetic layers, and
    at least one second ferromagnetic layer, a magnetization direction of each second ferromagnetic layer being pinned only by RKKY (Ruderman-Kittel-Kasuya-Yosida) coupling with at least one of the first ferromagnetic layers or with at least one other of the second ferromagnetic layers,
    wherein the magnetic moment of the permanent magnet per unit surface area (m$^2$) is greater than $(50 \times 10^{-2})/(4\pi)$ A (A is ampere).

2. The magnet as claimed in claim 1, in which a thickness of each first ferromagnetic layer is selected so that an assembly of the first ferromagnetic layer with the antiferromagnetic layer to which the first ferromagnetic layer is linked by an exchange coupling forms a magnet of which a field H* is of a same sign as a field $H_{ex}$ of the magnet and of which an absolute value of the field H* is greater than 795 A/m, a field H* being a smallest intensity of magnetic field from which hysteresis of the magnet disappears, and the field $H_{ex}$ being the exchange field.

3. The magnet as claimed in claim 2, in which the thickness of each first ferromagnetic layer is at least five times less than a thickness of the antiferromagnetic layer with which the first ferromagnetic layer is linked by an exchange coupling.

4. The magnet as claimed in claim 1, in which each RKKY coupling between the second ferromagnetic layer and the one of the first ferromagnetic layers or another of the second ferromagnetic layers is systematically a ferromagnetic RKKY coupling.

5. The magnet as claimed in claim 1, in which each RKKY coupling between the second ferromagnetic layer and the one of the first ferromagnetic layers or another second ferromagnetic layer is systematically an antiferromagnetic RKKY coupling.

6. The magnet as claimed in claim 1, in which the stack comprises:
    an end antiferromagnetic layer, this end antiferromagnetic layer being closest to a top of the stack; and
    immediately below the end antiferromagnetic layer, a pattern repeated n times, immediately successively, in a stacking direction of the ferromagnetic and antiferromagnetic layers, where n is an integer greater than or equal to one, the pattern comprising in an order moving in the stacking direction:
        a first antiferromagnetic layer,
        a first ferromagnetic layer the magnetization direction of which is pinned by exchange coupling with the first antiferromagnetic layer,
        a superimposition of p second ferromagnetic layers, the magnetization direction of the second ferromagnetic layer, located at a bottom of the superimposition, being pinned by RKKY coupling with the first ferromagnetic layer located below, and the magnetization direction of each other second ferromagnetic layer of the superimposition being pinned by RKKY coupling with the second ferromagnetic layer of the superimposition located just below, where p is a whole number greater than or equal to one, and
        a first ferromagnetic layer the magnetization direction of which is pinned by exchange coupling with the first antiferromagnetic layer of the following pattern in the stack or with the end antiferromagnetic layer.

7. The magnet as claimed in claim 6, in which p is between one and ten.

8. The magnet as claimed in claim 6, in which p is between one and two.

9. The magnet as claimed in claim 6, in which n is greater than or equal to two.

10. The magnet as claimed in claim 1, in which the stack comprises a pattern repeated n times, immediately successively, in a stacking direction of the antiferromagnetic and ferromagnetic layers, where n is an integer greater than or equal to one, the pattern comprising:
    an antiferromagnetic layer;
    on each side of the antiferromagnetic layer:
        a first ferromagnetic layer the magnetization direction of which is pinned by exchange coupling with the antiferromagnetic layer, and
        a second ferromagnetic layer the magnetization direction of which is pinned by RKKY coupling with the first ferromagnetic layer; and
    a lamination layer made of a non-magnetic material located at one end of the pattern for magnetically isolating the pattern from the immediately following or preceding pattern in the same stack.

11. The magnet as claimed in claim 10, in which n is greater than or equal to two.

12. The magnet as claimed in claim 1, in which the magnet exhibits a form factor greater than or equal to two, the form factor being defined as a ratio of a length over a width of a parallelepiped of smallest volume fully containing the stack and the magnetization direction of each ferromagnetic layer of the permanent magnet being pinned in a direction parallel to the length of the parallelepiped.

13. The magnet as claimed in claim 1, in which, for all pairs of ferromagnetic layers of the stack, one of the selected relationships in a group consisting of the relationships $M_1 t_1 \geq 5 * M_2 t_2$ and $M_2 t_2 \geq 5 * M_1 t_1$, is satisfied, where:
    $M_1$ and $t_1$ are, respectively, a magnetization and a thickness of the first ferromagnetic layer of the pair, and
    $M_2$ and $t_2$ are, respectively, a magnetization and a thickness of the second ferromagnetic layer of the same pair,
    each pair of ferromagnetic layers of the stack comprising the second ferromagnetic layer and the first ferromagnetic layer which pins, only by RKKY coupling, the magnetization direction of the second ferromagnetic layer.

14. A magnetic field sensor comprising:
    a substrate extending essentially in a plane termed a "plan of the substrate;"

at least one permanent magnet movable with respect to the substrate in response to a variation in an amplitude or direction of a magnetic field to be measured;

a transducer attached onto the substrate, to convert a movement of the permanent magnet into an electrical value representative of the amplitude or direction of the magnetic field to be measured, wherein the permanent magnet is the permanent magnet according to claim 1.

15. A method for manufacturing the permanent magnet according to claim 1, the method comprising:

forming a stack of first ferromagnetic and antiferromagnetic layers;

heating the stack so as to reach a temperature higher than an ordering temperature for a material of magnetic layers of the stack;

applying, when the temperature is higher than the ordering temperature, a first magnetic field for aligning a magnetization direction of the ferromagnetic layers along a predetermined desired direction; and cooling the stack in the presence of a second magnetic field less than the first magnetic field to make an exchange coupling appear between each first ferromagnetic layer and an antiferromagnetic layer of the same stack, wherein the forming comprises the formation, in the stack, of second ferromagnetic layers separated from the first ferromagnetic layers and other second ferromagnetic layers by non-magnetic layers the thickness of which configured to enable an appearance of an RKKY coupling between the second ferromagnetic layer and the first ferromagnetic layer or the other second ferromagnetic layer so as to pin a magnetic direction of the second ferromagnetic layer only by the RKKY coupling with one of the first ferromagnetic layers or with at least one of the other second ferromagnetic layers.

16. The magnet as claimed in claim 6, in which n is greater than or equal to five.

17. The magnet as claimed in claim 10, in which n is greater than or equal to five.

18. The magnet as claimed in claim 1, wherein the magnet does not include a free layer having magnetization that is configured to rotate and align along a direction of an external magnetic field.

* * * * *